US005241287A

United States Patent [19]

Jen

[11] Patent Number: 5,241,287

[45] Date of Patent: Aug. 31, 1993

[54] ACOUSTIC WAVEGUIDES HAVING A VARYING VELOCITY DISTRIBUTION WITH REDUCED TRAILING ECHOES

[75] Inventor: Cheng-Kuei Jen, Brossard, Canada

[73] Assignee: National Research Council of Canada, Ottawa, Canada

[21] Appl. No.: 802,482

[22] Filed: Dec. 2, 1991

[51] Int. Cl.[5] .......... H03H 9/30

[52] U.S. Cl. .......... 333/143; 333/147; 333/145

[58] Field of Search .......... 333/141-145, 333/147; 310/335, 336, 357, 367; 73/597, 609, 617, 620, 629, 642, 644

[56] References Cited

U.S. PATENT DOCUMENTS

| | | | |
|---|---|---|---|
| 3,488,602 | 1/1970 | Seidel et al. | 333/141 X |
| 3,736,532 | 5/1973 | Armenakas | 333/145 |
| 3,789,327 | 1/1974 | Waldron et al. | 333/145 |
| 3,824,505 | 7/1974 | Borner | 333/145 |
| 3,922,622 | 11/1975 | Boyd et al. | 333/145 |
| 4,077,023 | 2/1978 | Boyd et al. | 333/147 |
| 4,330,768 | 5/1982 | Huang et al. | 333/195 X |
| 4,742,318 | 5/1988 | Jen et al. | 333/141 |
| 4,743,870 | 5/1988 | Jen et al. | 333/147 |

OTHER PUBLICATIONS

C. K. Jen et al., "Acoustic Characterization of Optical Fiber Glasses", SPIE, vol. 1590, pp. 107-119, Sep. 1991.

*Primary Examiner*—Robert J. Pascal
*Assistant Examiner*—Benny Lee
*Attorney, Agent, or Firm*—Juliusz Szereszewski

[57] ABSTRACT

Acoustic buffer rods are useful in the nondestructive ultrasonic evaluation of materials. In order to reduce the occurrence of spurious signals in the reflected acoustic waves forming an acoustic "image" of a sample, it is proposed to design buffer rods such that their radial acoustic velocity profile is graded, preferably having a parabolic shape. The lowest acoustic velocity of the buffer rod is in its center, i.e. at the longitudinal axis of the rod. This design is applicable to both unclad-ded buffer rods as well as to the core of cladded ones.

13 Claims, 6 Drawing Sheets

ACOUSTIC WAVEGUIDES HAVING A VARYING VELOCITY DISTRIBUTION WITH REDUCED TRAILING ECHOES

FIELD OF THE INVENTION

This invention relates to ultrasonic devices for nondestructive testing, and more particularly to solid acoustic waveguides, also called buffer rods, in which acoustic waves can propagate.

BACKGROUND OF THE INVENTION

Ultrasonic pulse-echo techniques are in widespread use for the nondestructive evaluation of materials. Since these techniques are sometimes applied in adverse conditions such as elevated temperatures and pressures, it is not practical to contact ultrasonic transducers directly with the materials tested thereby exposing the transducers to the adverse conditions. Instead, acoustic waveguides are installed between the transducers and the materials to transmit acoustic waves from the transducer into the material and back to the transducer for the detection of any discrete defects in the material under testing.

Known in the art is an elastic waveguide (U.S. Pat. No. 4,743,870 issued May 10, 1988 to Jen et al) for propagating acoustic waves which consists of an elongated solid core region and an outer cladding. The bulk longitudinal wave velocity of the cladding is larger than that of the core. Both the cladding and the core acoustic wave velocities are substantially uniform (step profile). The waveguide is useful for the propagation of elastic waves in a longitudinal mode.

Due to the wave diffraction effects and the finite diameter of the waveguide (buffer rod), spurious echoes may be present in the analyzed sample image. Also termed trailing echoes, these echoes will always arrive later than the directly transmitted or reflected longitudinal echoes and often interfere with the desired signals.

One way of dealing with trailing echoes is mentioned in a paper by H. J. McSkimmin, "Measurement of Ultrasonic Wave Velocities and Elastic Moduli for Small Solid Specimens at High Temperatures", J. Acoust. Soc. Am. 31, 287-295 (1959). A screw thread groove can be ground through the length of the rod to suppress spurious pulses (echoes) arising from mode conversion at the cylindrical boundaries of the rod. In the McSkimmin paper, the rod is made of fused silica. C. K. Jen at al. (J. Acoust. Soc. Am. 88 (1), July 1990) tested aluminum rods having two spiral V grooves surrounding the rod in the clockwise and counterclockwise direction. The tests confirmed that the provision of a thread is effective in reducing trailing echoes. Another alternative to the same effect, tested by Jen, (see the above-mentioned Jen paper), was to disturb the rod boundary such that the waves generated due to mode conversion along the rod would not be added in phase at the receiver. Based on this approach, a tapered buffer rod was prepared and found effective in reducing the trailing echoes.

It is also known in the art to produce optical fibers or lenses with graded refractive index profiles. For silica glass based optical applications, graded refractive index (n) profile can be achieved by way of chemical vapor deposition, ion exchange and sol-gel methods. In designing and manufacturing such fibers or lenses, it is essential to adjust the concentration of a dopant in the radial direction while maintaining the concentration uniform in the axial direction.

Recently, a relation between the refractive index profile and the acoustic velocity profile in silica or other materials has been investigated and reported in a paper by C. K. Jen (the present inventor), C. Neron, A. Shang, K. Abe, L. Bonnell, J. Kushibiki and C. Saravanos on "Acoustic Characterization of Optical Fiber Glasses" (SPIE, vol. 1590, pp. 107-119, Boston, OE/-Fibers'91, September 1991). The paper presents acoustic characterization of silica glasses doped with $GeO_2$, $P_2O_5$, F, $TiO_2$, $Al_2O_3$ or $B_2O_3$. Measurements of acoustic velocity at various dopant concentrations and associated measurements of optical refractive index have shown that alumina as dopant increases the acoustic velocity while the other dopants decrease it compared to that of the pure fused silica. The fiber preforms having step and graded refractive index profiles also show step and graded acoustic velocity profiles respectively.

SUMMARY OF THE INVENTION

While the roughening of the periphery of a waveguide and the other measures mentioned hereinabove are effective in reducing the occurrence of disturbances, particularly spurious effects, in the transmitted waves, they have certain disadvantages such technical difficulties encountered in threading or roughening a relatively thin glass rod or fiber.

According to the present invention, there is provided a solid elongated acoustic waveguide for transmitting acoustic waves, generated e.g. by a transducer into an object and reflected from the object. The waveguide is composed of a material such that the radial acoustic velocity profile of the waveguide is graded, the lowest acoustic velocity being in the center of the waveguide.

If the waveguide comprises an uncladded core, the acoustic velocity is preferably highest at the periphery of the waveguide (core). The shape of the radial acoustic velocity profile is preferably parabolic or Gaussian, but other profiles may be selected which are also effective in reducing the spurious effects (trailing echoes).

If the waveguide comprises a core and cladding in continuous contact therewith, the above criterion also applies. The acoustic velocity of the cladding may be uniform, but it should be at least equal to the peripheral acoustic velocity of the core.

The waveguide should preferably be made of a material having low acoustic loss, such as glasses, e.g. fused silica glass, metals and single crystals.

Tests conducted to validate the invention have shown the influence of the concentration of certain dopants on acoustic velocity in silica glasses. It has been found unexpectedly that the relation between the concentration of certain dopants, commonly used to vary the optical properties (refractive index) of glass, and the resulting acoustic properties (acoustic velocity) is different than the relation between the same concentration and the refractive index. Accordingly, in order to achieve the desired radial acoustic velocity profiles as defined above (i.e. with the lowest velocity in the centre of the core and the parabolic or Gaussian profile) it is necessary to use the appropriate calculation factors, as will be explained in detail hereinbelow.

BRIEF DESCRIPTION OF THE DRAWINGS

The invention is described in more detail below in conjunction with the accompanying drawings in which like numerals correspond to the same definitions throughout the figures.

DESCRIPTION OF PREFERRED EMBODIMENTS

Figure 1:
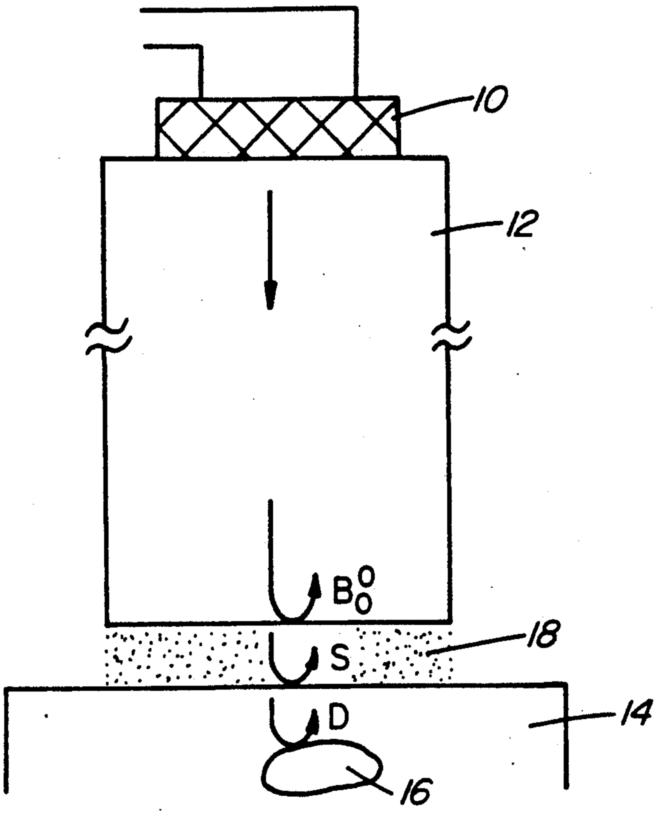
FIG. 1 shows a measurement system using an acoustic buffer rod for nondestructive evaluation of materials.

FIG. 1 represents schematically a typical measurement system for ultrasonic testing of materials. The system consists of a transducer 10 for converting electrical pulses generated by a pulse generator (not shown) to ultrasonic pulses and also for converting the reflected ultrasonic waves to electrical signals, and a solid buffer rod 12 i.e. an acoustic waveguide for transmitting the ultrasonic pulses. The buffer rod 12 contacts a tested object 14 in which defects 16 may be present. A layer of a liquid coupling medium 18 is provided between the waveguide and the tested object.

The signals received by the transducer 10 contain echoes $B_o^o$, S and D which result from the reflections of the transmitted signals from the end of the buffer rod, sample surface and the defect, respectively. If the acoustic velocity of the liquid couplant and the sample are known, the measured time delay between echoes S and D can be used to obtain the location of the defect.

In an elongated acoustic waveguide, acoustic waves are transmitted as longitudinal and shear waves. The accustic velocity of shear waves and longitudinal waves for a given waveguide is similar. Therefore, in further explanations, the term "velocity" or "acoustic velocity" will refer to longitudinal velocity only.

Figure 2A:
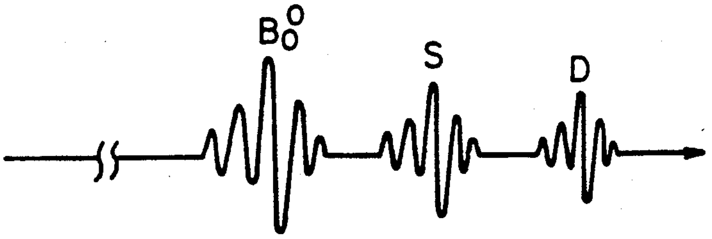
FIGS. 2*a* and 2*b* illustrate schematically signals obtained by the measurement system using a well designed and a poorly designed waveguide (buffer rod) respectively.
Figure 2B:
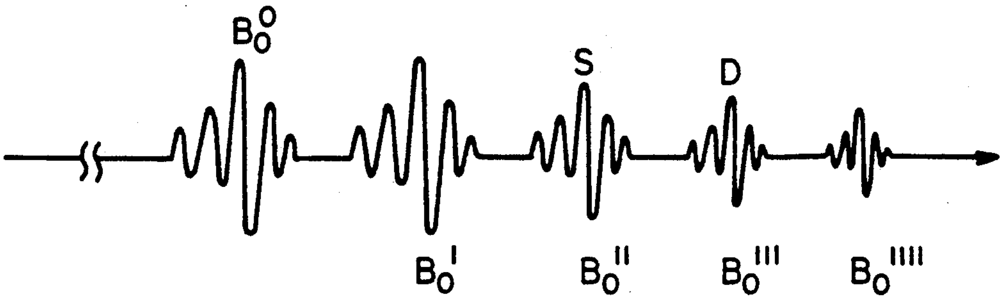

FIG. 2*a* shows the receiveed (reflected) signal obtained from a well designed buffer rod. Echoes $B_o^o$, S and D are clearly distinguishable. In FIG. 2*b*, not only are the echoes S and D smaller than those in FIG. 2*a*, but also the echoes S and D are overlapped with the trailing echoes ($B_o'$, $B_o''$, $B_o'''$, $B_o''''$ etc.) of the buffer rod (waveguide). These trailing echoes come from the wave diffraction and the finite diameter of the buffer rod. The arrival time delay difference, $t_b$, between echoes $B_o$ and $B_o'$ (or $B_o'$ and $B_o''$ etc.) is $$t_b = \frac{2a/\cos\theta}{V_S} - \frac{2a\tan\theta}{V_L} \quad (1)$$

where a is the rod radius; $\theta$ is equal to $\sin-1(V_S/V_L)$; $V_S$ and $V_L$ are the shear and longitudinal wave velocities in the isotropic rod. Since it is difficult to separate echoes S and D from the trailing echoes, the buffer rod of FIG. 2*b* is not properly designed.

Figure 3:
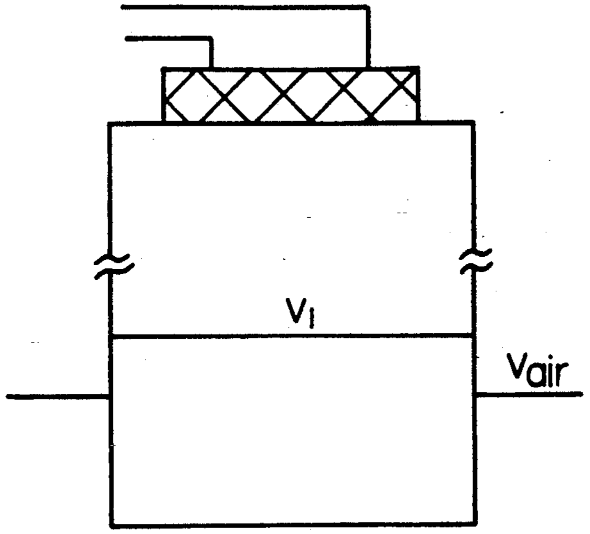
PRIOR ART FIG. 3
FIG. 3 shows a measurement system of FIG. 1 using a prior art waveguide (an uncladded buffer rod) and the radial acoustic velocity profile of the waveguide.

FIG. 3 shows a prior art uncladded buffer rod in which the radial acoustic velocity profile is uniform. The material of the buffer rod is glass on metal. The acoustic velocity of these materials is higher than that of surrounding air. Therefore, the radial acoustic profile in and around the rod will be as shown schematically in FIG. 3 where $V_1$ (acoustic velocity of the rod) is higher than V air.

Figure 6A:
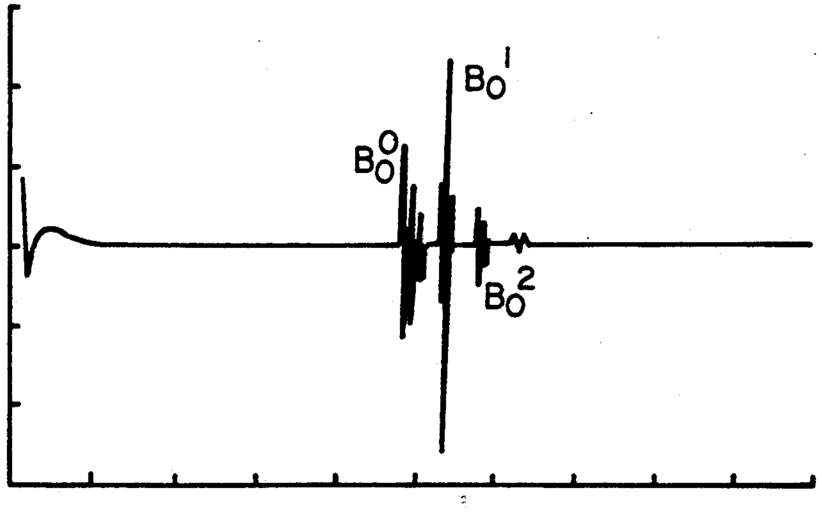
FIG. 6*a* shows typical signals reflected from the end of the waveguide of FIG. 3.

A typical signal image obtained from a buffer rod of FIG. 3 is shown in FIG. 6*a*. In this particular case, the rod of FIG. 3 is a 67 mm long pyrex glass rod of 10 mm diameter. It can be seen that the original B signal ($B_o^o$) is accompanied by at least two trailing echoes $B_o^1$ and $B_o^2$.

Figure 3A:
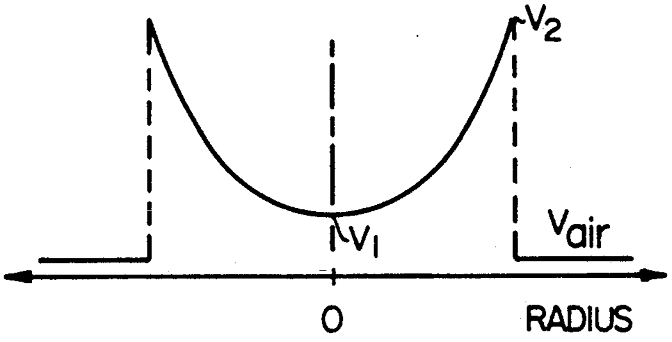
FIG. 3*a* shows the radial acoustic profile of an embodiment of uncladded waveguide of the invention.

For comparison, a buffer rod has been provided with a graded radial acoustic velocity profile as shown schematically in FIG. 3*a*. $V_1$ and $V_2$ are the velocities at the center and the edge of the buffer rod, respectively, both higher than 1. In the radial direction, the velocity profile $V_{(r)}$ can be defined by a formula where r is the radius of the buffer rod.

$$V_{(r)} = V_1\left[1 - \left(\frac{1 - V_2/V_1}{a^2}\right)r^2\right] \quad (2)$$

In the equation (2) the acoustic velocity profile is specifically parabolic. Due to technical limitations of the methods of manufacturing the waveguides of the invention, it is practically impossible to obtain an exactly parabolic radial acoustic velocity profile. It has been found that the waveguides perform reasonably well if the profile is a curve with a shape resembling a parabola or close to a parabolic shape. It is always essential that the lowest acoustic velocity of the waveguide be in the centre, i.e. at the longitudinal axis of the waveguide.

It will be appreciated that there is an infinite number of parabolic shapes. Only a limited number of tests has been conducted to validate the invention, and the results of the tests all confirm that a graded radial acoustic velocity profile is, to a degree dependent on a number of design factors, effective in reducing the occurrence of trailing echoes and in maximizing the directly reflected longitudinal echo or echoes.

As a result of the parabolic, or approximately parabolic variation of the acoustic velocity profile, an acoustic ray incident on the front surface of the waveguide of the invention follows a sinusoidal path, rather than a zig-zag path, along the rod. The period of the sinusoidal path is called the pitch P and is given by a formula $$P = 2\pi/\sqrt{Q} \quad (3)$$

where Q is a positive constant. The constant can be varied to achieve different pitches.

Figure 6B:
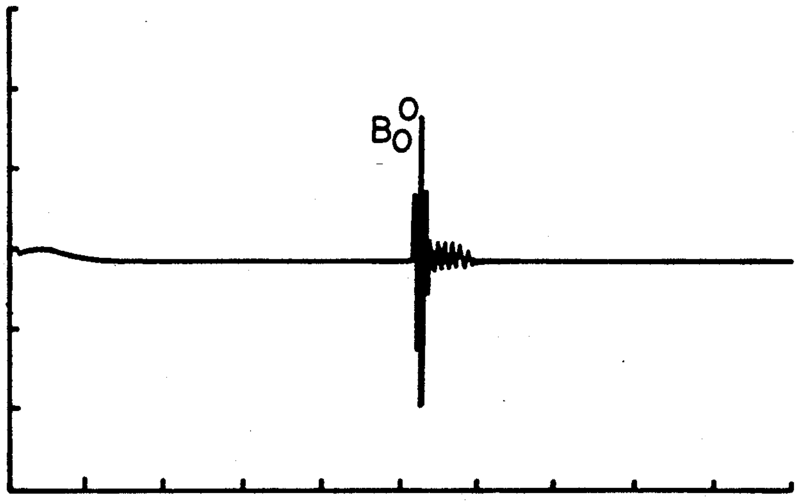
FIG. 6*b* shows typical signals reflected from the end of the waveguide of FIG. 3*a*.

As shown in FIG. 6b, an acoustic waveguide of the invention, with a graded velocity profile as in FIG. 3a exhibits a clearly better acoustic image of signal $B_o^0$ reflected from the end of the waveguide. The trailing echoes are virtually almost eliminated in the waveguide of FIG. 3a despite its smaller diameter, 5.4 mm, compared to 10 mm of that of FIG. 3.

Figure 3B:
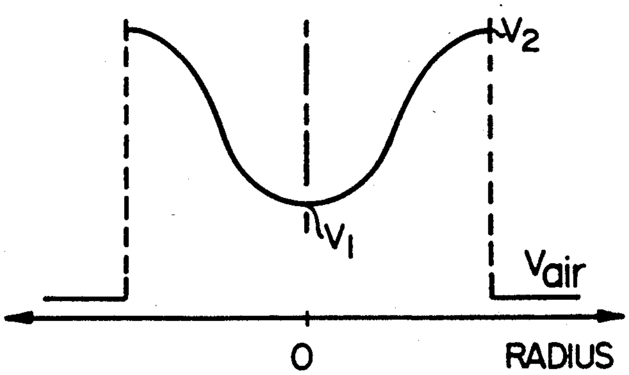
FIG. 3*b* shows the radial acoustic profile of another embodiment of uncladded waveguide of the invention.

FIG. 3b illustrates another embodiment of the invention, wherein the uncladded buffer rod has a radially graded acoustic velocity profile which is close to, or exactly, of a Gaussian shape, i.e. the shape of a Gaussian (normal) distribution curve. The definitions $V_1$, $V_2$ and $V_{air}$ have the same meaning as in FIG. 3a. In the tests, the buffer rod having this velocity profile was effective in reducing the trailing echoes.

Figure 4:
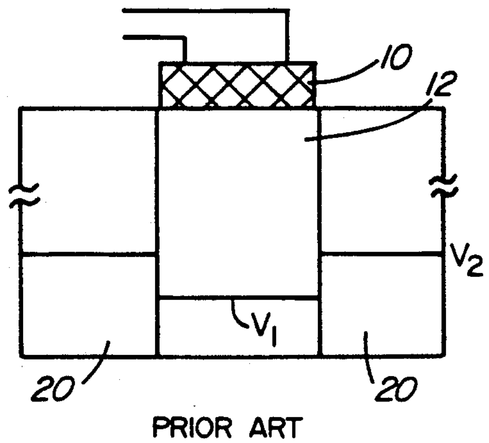
PRIOR ART FIG. 4
FIG. 4 illustrates another prior art waveguide (a cladded buffer rod) and its radial acoustic velocity profile.

FIG. 4 shows another prior art waveguide, a cladded buffer rod according to U.S. Pat. No. 4,743,870 issued May 10, 1988 to Jen et al, discussed in the Background section hereinabove. The acoustic velocity profile of the rod is indicated in FIG. 4. The radial velocity $V_1$ of the core 12 is uniform and lower than the velocity $V_2$ of the cladding 20. The buffer rods tested were 35 cm long, 4.8 mm core diameter and 98 mm total diameter.

Figure 4A:
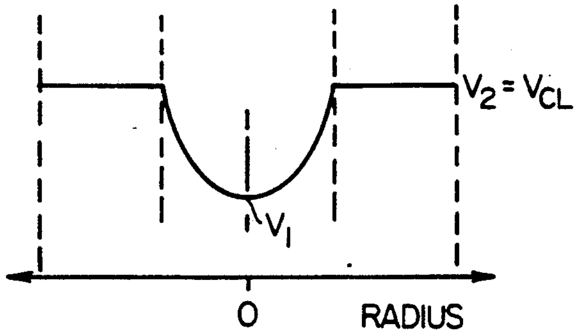
FIG. 4*a* shows the radial acoustic velocity profile of an embodiment of a cladded waveguide of the invention.

In FIG. 4a, the radial acoustic velocity profile of the cladded buffer rod, of a size as in the FIG. 4 embodiment, is approximately parabolic. It can be seen that the highest acoustic velocity of the core $V_2$, is at the periphery of the core and is equal to the acoustic velocity of the cladding, while $V_1$ is the acoustic velocity at the center of the rod.

Figure 7B:
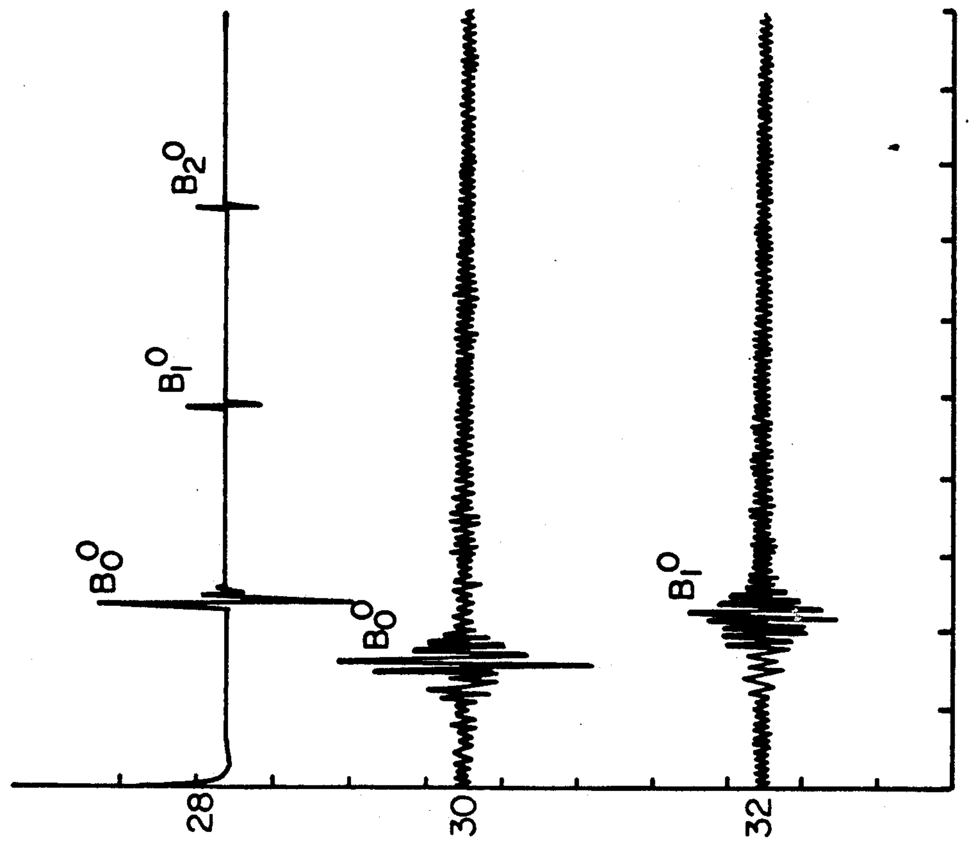
FIG. 7*a* shows signals reflected from the end of the cladded waveguide of FIG. 4*a*.
Figure 7A:
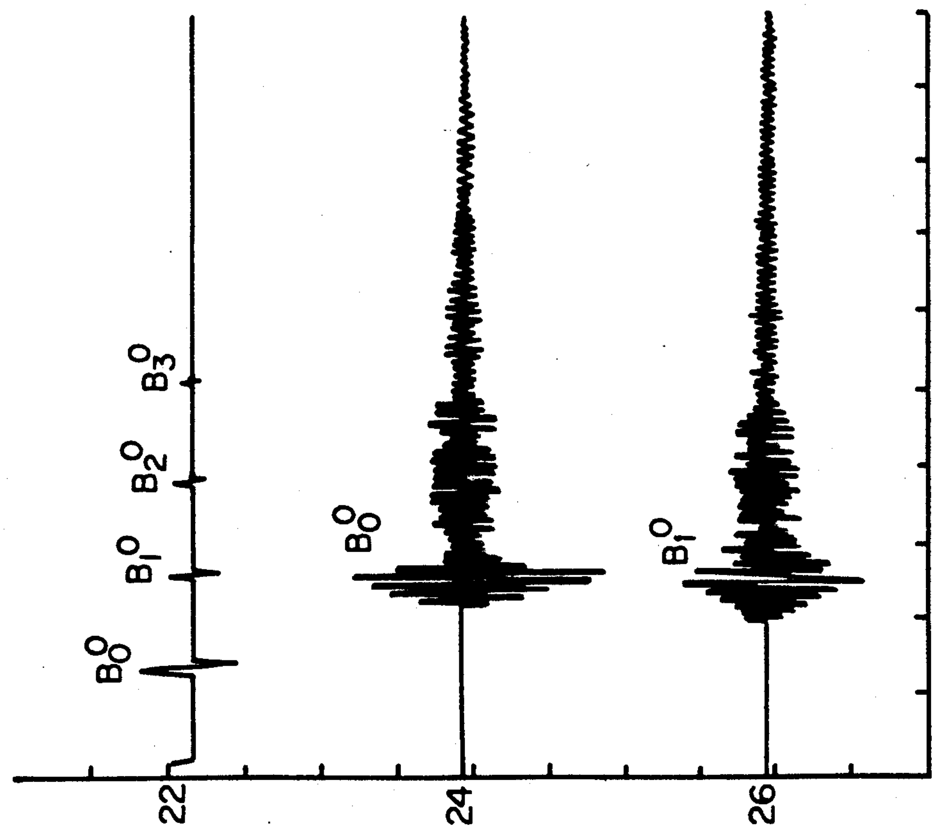

The signals reflected from the end of the waveguide of FIG. 4 and FIG. 4a are illustrated in FIGS. 7a and 7b respectively. The top image 22 in FIG. 7a represents the reflected echoes $B_o^0$ (original signal), $B_1^o$, $B_2^o$ and $B_3^o$ (multiple reflected signals) and the images 24 and 26 are zoomed pictures near the echoes $B_o^o$ and $B_1^o$, respectively.

Similarly, the top image 28 in FIG. 7b represents the reflected echoes $B_o^o$ (original signal), $B_1^o$ and $B_2^o$ and the images 30 and 32 are the zoomed pictures of the particular echoes.

It will be seen that the echoes in FIG. 7b are more distinctive than those in FIG. 7a.

For the purpose of quantitation of the invention, a parameter Ω will be defined as follows:

$$\Omega = 2\pi f a\left(\frac{1}{V_1^2} - \frac{1}{V_2^2}\right)^{\frac{1}{2}} \quad (4)$$

where a is the rod radius, f is the acoustic operating frequency, and $V_1$ and $V_2$ are the acoustic velocities at the centre and the periphery of the core of the waveguide. For the buffer rod of FIG. 3a the Ω is preferably greater than 2.4 and $(V_2-V_1)/V_1$ is greater than 2%. Higher Ω and relative velocity difference offer less crosstalk amoung buffer rods if they contact each other.

For the buffer rod characterized by FIG. 4a, the operational frequency applied was 10 MHz (also in the uniform velocity rod of FIG. 4) and the Ω was 11.

Figure 4B:
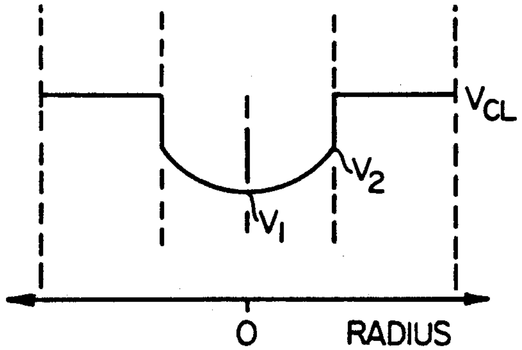
FIG. 4*b* shows the radial acoustic velocity profile of another embodiment of a cladded waveguide of the invention.

FIG. 4b illustrates a modification of the embodiment of FIG. 4a with the highest core acoustic velocity $V_2$ being smaller than the (uniform) acoustic velocity of the cladding $V_{cl}$. The performances of the waveguides of FIG. 4a and FIG. 4b are similar.

For cladded waveguides of the invention, illustrated by way of their acoustic velocity profiles in FIGS. 4a and 4b, it is advantageous that the material density ρ at the periphery ("edge") of the core be the same or nearly the same as the material density of the uniform cladding.

Figure 5:
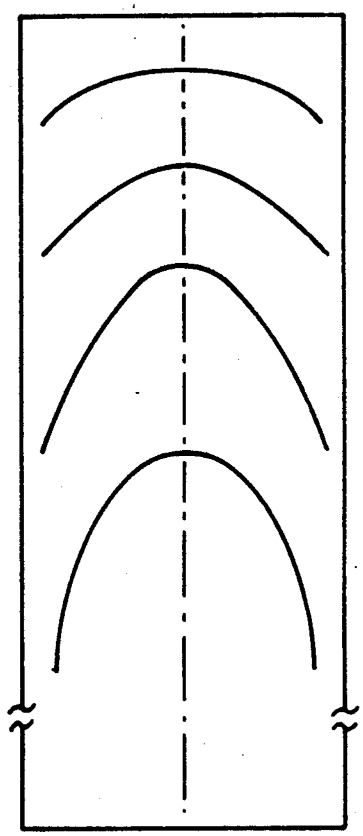
FIG. 5 illustrates schematically the axial distribution of radial acoustic velocity profiles of another embodiment of a waveguide of the invention.

FIG. 5 shows an elongated buffer rod according to yet another embodiment of the invention. Along the buffer rod the parabolic velocity profiles, shown in this figure, vary gradually so that the "flatter" parabolic shapes at the top become gradually "sharper" towards the "lower" end of the rod as situated in FIG. 5. This corresponds to gradually higher acoustic velocity at the periphery of the rod compared to the center thereof.

It will be appreciated that the parabolic profiles of FIG. 5 may be substituted by Gaussian profiles.

As a result of the design of FIG. 5, the acoustic energy will be focused at the sharper end and expanded in the flatter end. Therefore, this particular embodiment not only has less spurious signal but can also be used as a focusing or beam expander device.

Figure 8A:
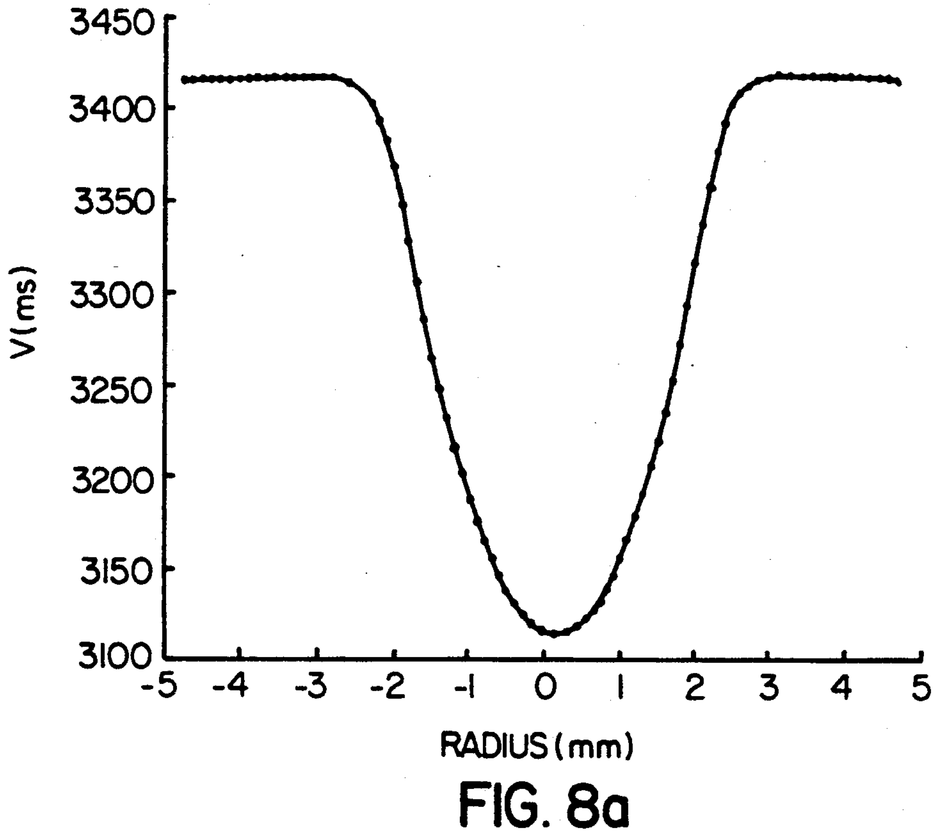
FIG. 8*a* shows the measured radial acoustic velocity profile of a waveguide of the invention according to FIG. 4*a*.

The actually measured radial velocity profile of an embodiment of FIG. 4a is shown in FIG. 8a. It will be seen that the difference between the acoustic velocity at the center and the periphery is approximately 290 m/s or 8.5%. The dopant was germanium dioxide.

Figure 8B:
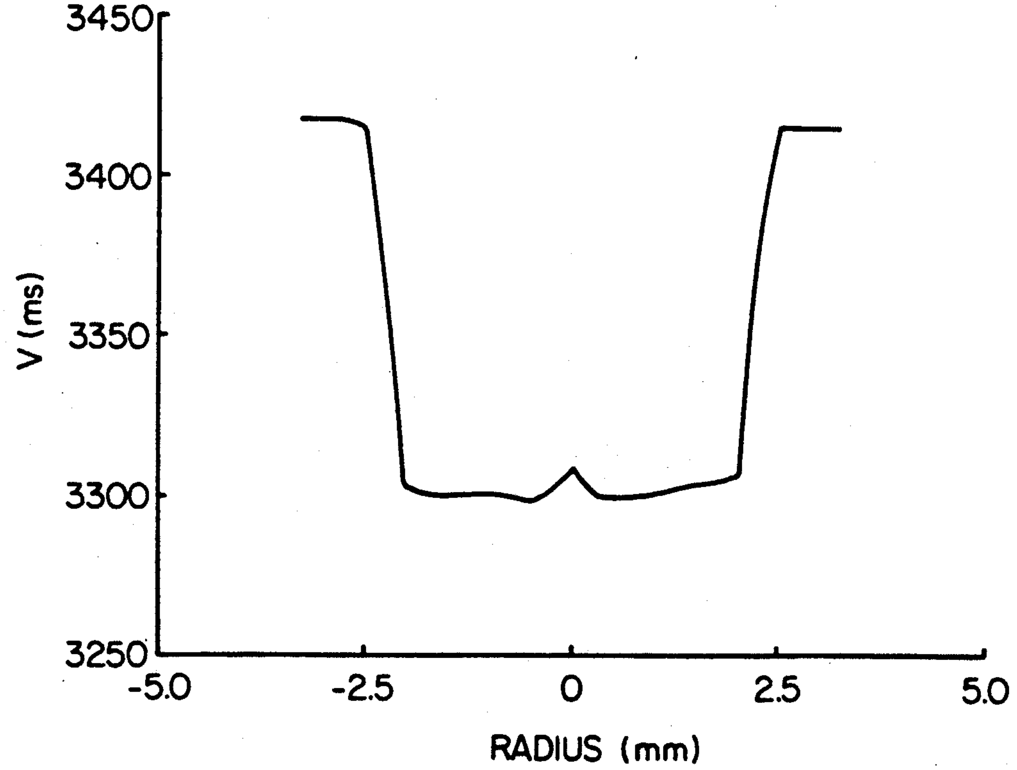
FIG. 8*b* shows the measured radial acoustic velocity profile of a prior art waveguide according to FIG. 4.

For a conventional cladded buffer rod, the measured profile is shown in FIG. 8b, the core velocity profile is substantially uniform. The silica rod core was doped with fluorine.

The waveguides of the invention may be made of a metal such as steel, aluminum, zirconium, nickel and tin; glasses, e.g. fused silica; single crystals such as lithium niobate, lithium titanate, germanium and silicon; and ceramics such as alumina, silicon carbide and silicon nitride.

Glasses are preferred waveguide materials because of their relative price and the processing facility. However, it is feasible to obtain rods of other low-loss materials with the acoustic characteristics of the invention.

The cladding materials are commonly known in the art and will not be discussed herein.

For glasses, e.g. silica glasses, graded acoustic velocity profiles of the invention can be obtained using well known technique such as modified chemical vapor deposition, ion exchange and sol-gel methods. The parabolic or Gaussian profiles as illustrated in FIGS. 3a, 3b, 4a and 4b can be obtained by applying different, controlled dopant concentrations in the radial direction of the rod. The velocity distribution shown in FIG. 5 can also be obtained using the above methods together with thermal diffusion method.

Dopants suitable to produce the graded acoustic velocity profiles of the invention are, preferably, $GeO_2$, $B_2O_3$, $TiO_2$, F and $P_2O_5$. As explained below, these dopants exhibit a similar relationship between their concentration and the resulting acoustic velocity change. Alumina ($Al_2O_3$) shows a diametrically different concentration influence on the velocity variation.

A reflection scanning acoustic microscope (SAM) was used in this work to characterize silica glasses doped with the above-listed dopants at different concentration. Unlike in prior art attempts by others where only averaged bulk acoustic wave (BAW) velocities could be obtained, we obtained quantitative elastic constants of several different glass plates with a line-focus-beam SAM (LFBSAM) and acoustic profiles of optical rods with a point-focus-beam SAM(PFBSAM). The reflection scanning acoustic microscopy and V(z) technique provided the leaky surface acoustic wave (LSAW) and leaky surface-skimming compressional wave (LSSCW) velocities. The principles of reflection SAM and V(z) curve measurements are described by J. Kushibiki and N. Chubachi in IEEE Trans. Sonics and Ultrason., Vol. SU-32, pp. 189–212, 1985 and by A. Atalar in J. Appl. Phys., Vol. 49, pp. 5130–5139, 1978; V(z) is the voltage response of the piezoelectric transducer of the SAM lens while the lens is moving toward or away from the sample along the lens axis direction, z. Because LSAW and LSSCW have predominantly shear and longitudinal wave components, respectively, their velocity variations due to different dopants or dopant concentrations could be approximately regarded as those of the shear $V_S$ and the longitudinal velocity $V_L$. For fused silica, $V_S/V_{LSAW}=1.102$; $V_L/V_{LSSCW}=1.014$.

Detailed explanations of the measurement techniques and the sample preparation methods are provided in a paper by C. K. Jen et al, Acoustic characterization of optical fiber glasses, SPIE, Vol. 1590, pp. 107–119, Boston, OE/Fibers '91, Sep. 1991.

The following table serves to illustrate the influence of certain dopants and their concentration on the acoustic velocity variation as compared to the refractive index (n) variations.

TABLE 1

Measured Δn % $\Delta V_s$ and $\Delta V_L$ versus dopant concentration W %

| Dopant | Δn %/W % | $\Delta V_s$ %/W % | $\Delta V_L$ %/W % |
|---|---|---|---|
| $GeO_2$ | +0.05625 | −0.49 | −0.47 |
| $P_2O_5$ | +0.01974 | −0.41 | −0.31 |
| F | −0.313 | −3.1 | −3.6 |
| $TiO_2$ | +0.2347 | −0.45 | −0.59 |
| $Al_2O_3$ | +0.06285 | +0.21 | +0.42 |
| $B_2O_3$ | −0.03294 | −1.1 | −1.2 |

It will be appreciated, in view of the above data, that in order to obtain the radially graded velocity profiles of the invention, the concentration of $Al_2O_3$ at the centre of the waveguide should be the lowest while for the other dopants, the opposite would apply.

It is apparent from Table 1 that the variation of acoustic velocities in silica glass due to dopant concentration change is much larger than that of the dopant concentration that the refractive index. It will also be noted that the refractive index slopes are not always consistent with the corresponding acoustic velocity slopes. For example, the refractive index slope for $GeO_2$, $P_2O_5$, and $TiO_2$ is positive (index rises with dopant concentration) while the acoustic velocity slopes for these dopants are negative.

Because of the linear relationships of both Δn and ΔV to the dopant concentration, glasses with step and graded refractive index profiles also show step and graded acoustic wave velocity profiles respectively.

It will also be understood that while only a single waveguide has been illustrated and discussed hereinabove, it is also possible to apply an array of waveguides of the invention associated with a transducer, for example to probe different parts of the sample at the same time. The length of each waveguide can be different to provide different time delays.

I claim:

1. A solid elongated acoustic waveguide for transmitting longitudinal acoustic waves therealong, said waveguide comprising:

an elongated solid core member having a first end, a second end, a central longitudinal axis extending between said ends and a peripheral surface surrounding said longitudinal axis, the core member being of a material which allows longitudinal acoustic waves to propagate therethrough, wherein the properties of said material gradually vary over a distance between the longitudinal axis and the peripheral surface of the core member, to vary correspondingly the velocity of said longitudinal acoustic waves over said distance, the distribution of said velocities in a direction perpendicular to the longitudinal axis defining an arcuate profile with a lowest velocity being at the longitudinal axis and a highest velocity being at the peripheral surface of said core member, the arcuate distribution profile being effective to cause the longitudinal acoustic waves transmitted through said core member to be periodically focused along the longitudinal axis of the core member thereby reducing the occurrence of spurious signals in said longitudinal acoustic waves.

2. The acoustic waveguide according to claim 1 wherein said core member is approximately circular in cross section with a uniform radius along the peripheral surface.

3. The acoustic waveguide according to claim 2 wherein said arcuate profile is approximately parabolic.

4. The acoustic waveguide according to claim 2 wherein said arcuate profile is approximately Gaussian.

5. The acoustic waveguide according to claim 1 wherein the arcuate profile is approximately parabolic.

6. The acoustic waveguide according to claim 1 further comprising a cladding which is disposed adjacent the peripheral surface of, and encloses said core member along the longitudinal axis, said cladding being of a material having longitudinal acoustic velocity greater than or equal to the highest acoustic velocity of the material of said core member.

7. The acoustic waveguide according to claim 1 wherein the arcuate profile is approximately Gaussian.

8. The acoustic waveguide according to claim 1 wherein the core member is of a low acoustic loss material.

9. The acoustic waveguide according to claim 1 wherein said core member material contains a dopant at a concentration which is effective to change the longitudinal acoustic velocity within said material as a function of the concentration of the dopant in the material, the concentration of the dopant being graded in a direction perpendicular to the longitudinal axis of the core member to provide said arcuate profile of the distribution of longitudinal acoustic velocities in said core member.

10. The acoustic waveguide according to claim 9 wherein the dopant is at least one compound selected from the group consisting of germanium dioxide, phosphorus pentoxide, fluorine, titanium dioxide and boron oxide and the concentration of the dopant is highest at the longitudinal axis of the core member.

11. The acoustic waveguide according to claim 9 wherein the dopant is alumina and the concentration of the alumina is lowest at the longitudinal axis of the core member.

12. The acoustic waveguide according to claim 1 wherein the velocity distribution profile is such as to cause the longitudinal acoustic waves transmitted through said core member to follow a sinusoidal path along said core member.

13. The acoustic waveguide according to claim 1 wherein the properties of said core member material also vary gradually along the longitudinal axis of the core member so that the arcuate profile is gradually varied in an axial direction of the core member.

* * * * *